(12) United States Patent
Yasukouchi et al.

(10) Patent No.: US 6,806,770 B2
(45) Date of Patent: Oct. 19, 2004

(54) OPERATIONAL AMPLIFIER

(75) Inventors: Katsuyuki Yasukouchi, Kasugai (JP); Ayuko Watabe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/419,233

(22) Filed: Apr. 21, 2003

(65) Prior Publication Data

US 2003/0201828 A1 Oct. 30, 2003

(30) Foreign Application Priority Data

Apr. 24, 2002 (JP) ........................................ 2002-122154

(51) Int. Cl.[7] .............................. H03F 3/45; H03F 3/18
(52) U.S. Cl. ........................ 330/257; 330/263; 330/255
(58) Field of Search ................................. 330/257, 263, 330/255

(56) References Cited

U.S. PATENT DOCUMENTS 5,442,320 A * 8/1995 Kunst et al. ................. 330/267
5,512,859 A * 4/1996 Moraveji ..................... 330/267
6,552,613 B2 * 4/2003 Murray et al. ............... 330/255

OTHER PUBLICATIONS

U.S. patent application Ser. No. 10/108,341, U.S. 2003/0042982, Katsuyuki Yasukouchi et al., filed Mar. 6, 2003.

* cited by examiner

Primary Examiner—Patricia Nguyen
(74) Attorney, Agent, or Firm—Arent Fox, PLLC.

(57) ABSTRACT

An operational amplifier for increasing the response speed of its output voltage relative to an input signal while increasing the tolerable amplitude of the output voltage. The operational amplifier includes a PNP output transistor connected to a high potential power supply, an NPN output transistor connected between the PNP output transistor and a low potential power supply, and a drive unit, which drives each output transistor in accordance with an input current. The drive unit includes a current source, a first current mirror circuit, and a second mirror circuit. The input current is supplied to a node between the first and second current mirror circuits. The base of the NPN output transistor is connected to the node, and the base of the PNP output transistor is connected to a further node between the current source and the first current mirror circuit.

16 Claims, 9 Drawing Sheets

OPERATIONAL AMPLIFIER

CROSS-REFERENCE TO RELATED APPLICATION

This application is based upon and claims the benefit of priority from Japanese Patent Application No. 2002-122154, filed on Apr. 24, 2002, the entire contents of which are incorporated herein by reference.

BACKGROUND OF THE INVENTION

The present invention relates to an operational amplifier that uses a bipolar transistor in an output circuit.

Nowadays, semiconductor devices used in various types of electronic equipment are required to have a lower power supply voltage and lower power consumption. Thus, the output voltage of an operational amplifier mounted on a semiconductor device tends to decrease. Accordingly, an operational amplifier that functions under a lower power supply voltage without decreasing its output voltage is required.

FIG. 1 is a schematic circuit diagram of an operational amplifier (hereafter, referred to as op amp) 50 in the prior art. The op amp 50 has a pure complementary output circuit, which includes an NPN source output transistor Tr9 and a PNP sink output transistor Tr7. The op amp 50 uses a bipolar transistor to achieve the required temperature characteristics and large output current and to guarantee reliability in the manufacturing process.

The base of a PNP transistor Tr1 receives an input voltage IN1, and the collector of the PNP transistor Tr1 is connected to the collector of an NPN transistor Tr3. The base of a PNP transistor Tr2 receives an input voltage IN2, and the collector of the PNP transistor Tr2 is connected to the collector of an NPN transistor Tr4. The NPN transistors Tr3 and Tr4 configure a current mirror circuit. The emitters of the transistors Tr1 and Tr2 are connected to a common power supply 1.

The power supply 1 supplies the transistors Tr1 and Tr2 with a constant current in accordance with a power supply Vcc. The bases of the transistors Tr3 and TR4 are connected to the collector of the transistor Tr4. The emitters of the transistors Tr3 and tr4 are connected to the ground GND.

The collectors of the transistors Tr1 and Tr3 are connected to the base of an NPN transistor Tr5. The emitter of the transistor Tr5 is connected to the ground GND. The collector of the transistor Tr5 is connected to the bases of PNP transistors Tr6 and Tr7 and to the collector of the transistor Tr6. The transistors Tr6 and Tr7 configure a current mirror circuit.

The emitter of the transistor Tr6 is connected to the emitter of an NPN transistor Tr8. The emitter of the NPN transistor Tr7 is connected to the emitter of an NPN transistor Tr9. The bases of the transistors Tr8 and Tr9 and the collector of the transistor Tr8 are connected to a current source 2. The current source 2 generates constant current in accordance with the power supply Vcc. The collector of the transistor Tr9 is connected to the power supply Vcc. An output signal Vout is generated at the emitters of the transistors Tr9 and Tr7.

In the op amp 50, when the input voltage IN2 is greater than the input voltage IN1, the collector current of the transistor Tr2 decreases, and the base current of the transistors Tr3 and Tr4 decreases. This decreases the collector current of the transistors Tr3 and Tr4.

Since the collector current of the transistor Tr1 does not change, the base current of the transistor Tr5 increases. As a result, the collector current of the transistors Tr6 and Tr7 increases. The base current of the transistors Tr8 and Tr9 are constant in accordance with the current source 2. Thus, the collector current of the transistors Tr8 and Tr9 is constant. Accordingly, the output voltage Vout decreases.

When the input voltage IN2 is less than the input voltage IN1, the collector current of the transistor Tr2 increases, and the base current of the transistors Tr3 and Tr4 increases. This increases the collector current of the transistors Tr3 and Tr4.

Since the collector current of the transistor Tr1 does not change, the base current of the transistor Tr5 decreases. As a result, the collector current of the transistors Tr6 and Tr7 decreases. The base current of the transistors Tr8 and Tr9 is constant in accordance with the current source 2. Thus, the collector current of the transistors Tr8 and Tr9 is constant. Accordingly, the output voltage Vout increases.

In the op amp 50, the idling current of the transistors Tr9 and Tr7 may be set at a small value with the current source 2. However, in the op amp 50, the maximum output voltage VoutH is less than the power supply Vcc by at least an amount corresponding to the base-emitter voltage drop VBE. The minimum output voltage VoutL is greater than the power supply Vcc by at least an amount corresponding to the base-emitter voltage drop VBE. Accordingly, when decreasing the amplitude of the output voltage Vout to decrease the power supply voltage, the amplitude of the output voltage is insufficient.

The transistor Tr5 is arranged between the transistors Tr1, Tr2 and the transistors Tr9, Tr7. This decreases the response speed of the output voltage Vout relative to the input voltages IN1 and IN2.

FIG. 2 illustrates another op amp 50A in the prior art. Output transistors Tr16 and Tr18 are both NPN transistors. The op amp 50A includes a sub-complementary output circuit.

The base of a PNP transistor Tr11 receives an input voltage IN3, and the collector of the PNP transistor Tr11 is connected to the collector of an NPN transistor Tr13. The base of a PNP transistor Tr12 receives an input voltage IN4, and the collector of the PNP transistor Tr12 is connected to the collector of an NPN transistor Tr14. The NPN transistors Tr13 and Tr14 configure a current mirror circuit. The emitters of the transistors Tr11 and Tr12 are connected to a common power supply 3.

When the input voltage IN4 is greater than the input voltage IN3, the collector current of the transistor Tr12 decreases. Thus, the base current of an NPN transistor Tr15 decreases, and the collector current of the transistor Tr15 decreases. When the collector current of the transistor Tr15 decreases, the base current of the NPN source output transistor Tr16 increases, and the collector current of the output transistor Tr16 increases.

Further, when the collector current of the transistor Tr15 decreases, the base current of a PNP transistor Tr17 decreases, and the collector current of the transistor Tr17 decreases. When the collector current of the transistor Tr17 decreases, the base current of an output transistor Tr18 decreases, and the collector current of the output transistor Tr18 decreases.

When the input voltage IN4 is less than the input voltage IN3, the collector current of the transistor Tr12 increases. Thus, the base current of the transistor Tr15 increases, and the collector current of the transistor Tr15 increases. When the collector current of the transistors Tr15 increases, the base current of the output transistor Tr16 decreases, and the collector current of the output transistor Tr16 decreases.

Further, when the collector current of the transistor Tr15 increases, the base current of a PNP transistor Tr17 increases, and the collector current of the transistor Tr17 increases. When the collector current of the transistor Tr17 increases, the base current of the NPN sink output transistor Tr18 increases, and the collector current of the output transistor Tr18 increases.

The collector current of the transistor Tr17 is supplied as the collector current of the NPN transistor Tr19. An idling current setting circuit, which includes transistors Tr20 to Tr22 and a resistor R, control the base current of the transistor Tr19.

The idling current setting circuit detects the output voltage Vout and increases the base current of the transistor Tr19 when the output voltage Vout increases to increase the collector current of the transistor Tr19. When the output voltage Vout decreases, the idling current setting circuit decreases the base current of the transistor Tr19 to decrease the collector current of the transistor Tr19.

The base potential VB19 at the transistor Tr19 is greater than the output voltage Vout by an amount corresponding to the base-emitter voltage drops VBE16, VBE17, and VBE19 at the corresponding transistors Tr16, Tr17, and Tr19. Further, the base potential VB19 is greater than the output voltage Vout by an amount corresponding to the base-emitter voltage drops VBE20, VBE21, and VBE22 at the corresponding transistors Tr20, Tr21, and Tr22. Accordingly, the base-emitter voltage drop VBE20 of the transistor Tr20 is about the same as the base-emitter voltage drop VBE16 of the transistor Tr16.

In the op amp 50A, when the collector current of the transistor Tr15 increases in accordance with the input voltages IN3 and IN4, the collector current of the output transistor Tr16 decreases, the collector current of the output transistor Tr18 increases, and the output voltage Vo decreases. When the collector current of the transistor Tr15 decreases in accordance with the input voltages IN3 and IN4, the collector current of the output transistor Tr16 increases, the collector current of the output transistor Tr18 decreases, and the output voltage Vo increases.

In this state, the idling current that flows through the output transistor Tr16 is set by the base-emitter voltage drop at the transistor Tr20, and the idling current of the transistor Tr18 is set by the collector current of the transistor Tr20. When the tolerable supply current I1 and I2 of the current sources 4 and 5 are the same, the idling current Id that flows to the ground GND from the power source Vcc via the output transistors Tr16 and Tr18 is expressed by the following equation, in which Q16, Q17, Q19, Q20, Q21, and Q22 respectively represent the sizes of the transistors Tr16, Tr17, Tr19, Tr20, Tr21, and Tr22.

$$Id = I2 \times (Q19/Q22) \times (Q17/Q21) \times (Q16/Q20)$$

In the op amp 50A, the sink output transistor Tr18 of the sub-complementary output circuit is an NPN transistor. Thus, the minimum output voltage VoutL substantially decreases to the ground GND level. However, to have the idling current setting circuit function normally, a potential difference that is greater than at least the sum of the base-emitter voltage drops VBE20 to VBE22 is necessary between the output voltage Vout and the power supply Vcc. Accordingly, the maximum output voltage VoutH cannot be sufficiently increased to the level of the power supply Vcc.

To decrease power consumption, the idling current Id must be reduced. To reduce the idling current Id, the current source 5, the supply current I2 of the current source 5 may be reduced. However, the reduction of the supply current I2 reduces the maximum output current of the output transistor Tr18 and decreases the load drive capacity. Accordingly, the idling current Id cannot be reduced while maintaining the load drive capacity A Darlington-connected source output transistor Tr16 may be used to increase the output current of the source output transistor Tr16 and improve the load drive capacity. In such a case, to match the base-emitter voltage drops VBE16 and VBE20 of the output transistor Tr16 and the transistor Tr20, a diode-connected transistor may be arranged between the bases of the transistors Tr16 and Tr17. This would cause the supply current I1 of the current source 4 to affect the value of the voltage drop VBE16. As a result, differences between transistors increase the fluctuation of the idling current Id.

In the op amp 50A, the transistors Tr15 and Tr17 are arranged between the input transistors Tr11, Tr12 and the output transistors Tr16, Tr18. This decreases the response speed of the output voltage Vout relative to the input voltages IN3 and IN4.

SUMMARY OF THE INVENTION

One aspect of the present invention is an operational amplifier for use with high and low potential power supplies and for receiving an input current. The operational amplifier includes a first output transistor connected to the high potential power supply and having a control terminal. A second output transistor is connected between the first output transistor and the low potential power supply and has a control terminal, with an output voltage being available at an output node between the first output transistor and the second output transistor. A drive unit is connected to the first and second output transistors to drive the first and second output transistors in accordance with the input current. The drive unit includes a current source connected to the high potential power supply. A first current mirror circuit is connected to the current source. A second current mirror circuit is connected between the first current mirror circuit and the low potential power supply. The input current is supplied to a first node between the first and second current mirror circuits. The control terminal of the second output transistor is connected to the first node, and the control terminal of the first output transistor is connected to a second node between the current source and the first current mirror circuit.

A further aspect of the present invention is an operational amplifier for use with high and low potential power supplies and for receiving an input current. The operational amplifier includes a first output transistor connected to the high potential power supply and having a control terminal. A second output transistor is connected between the first output transistor and the low potential power supply and having a control terminal, with an output voltage being available at an output node between the first output transistor and the second output transistor. A drive unit is connected to the first and second output transistors to drive the first and second output transistors in accordance with the input current. The drive unit includes a current source connected to the high potential power supply. A first current mirror circuit is connected to the current source. A second current mirror circuit is connected between the first current mirror circuit and the low potential power supply. A first resistor is connected between the second current mirror circuit and the low potential power supply. The control terminal of the second output transistor is connected to a first node between the first and second current mirror circuits. The control terminal of the first output transistor is connected to a second node between the current source and the first current mirror circuit. The input current is supplied to a third node between the second current mirror circuit and the first resistor.

A further aspect of the present invention is an operational amplifier for use with high and low potential power supplies and a current source. The operational amplifier includes a first PNP transistor having a collector connected to the current source, a base connected to the collector, and an emitter connected to a high potential power supply. A second PNP transistor has a base connected to the base of the first PNP transistor and an emitter connected to the high potential power supply. A third PNP transistor has an emitter connected to a collector of the second PNP transistor. A fourth PNP transistor has an emitter connected to the collector of the second PNP transistor and to the emitter of the third PNP transistor. A fifth PNP transistor has a base connected to the bases of the first and second PNP transistors and an emitter connected to the high potential power supply. A sixth PNP transistor has a base connected to the base of the fifth PNP transistor and an emitter connected to the high potential power supply. A first NPN transistor has a collector and a base connected to a collector of the fifth PNP transistor and an emitter connected to a collector of the fourth PNP transistor. A second NPN transistor has a base connected to the base of the fifth PNP transistor, a collector connected to the collector of the sixth PNP transistor, and an emitter connected to a collector of the third PNP transistor. A third NPN transistor has a collector and a base connected to the emitter of the first NPN transistor and an emitter connected to the low potential power supply. A fourth NPN transistor has a collector connected to the emitter of the second NPN transistor, a base connected to the base of the third NPN transistor, and an emitter connected to the low potential power supply. A seventh PNP transistor has an emitter connected to the high potential power supply and a base connected to the collectors of the sixth PNP transistor and the second NPN transistor. A fifth NPN transistor has a collector connected to a collector of the seventh PNP transistor, a base connected to the emitter of the second NPN transistor and to the collector of the fourth NPN transistor, and an emitter connected to the low potential power supply.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
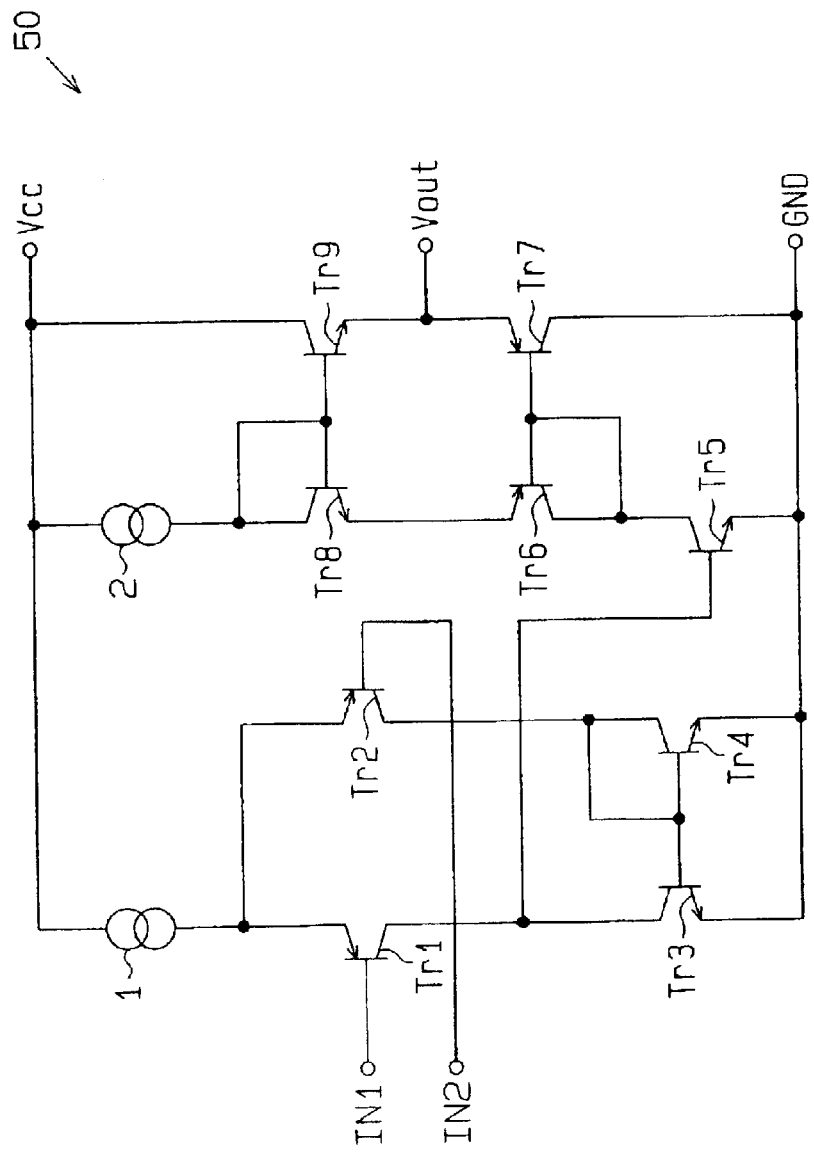
FIG. 1 is a schematic circuit diagram of a prior art op amp.
Figure 2:
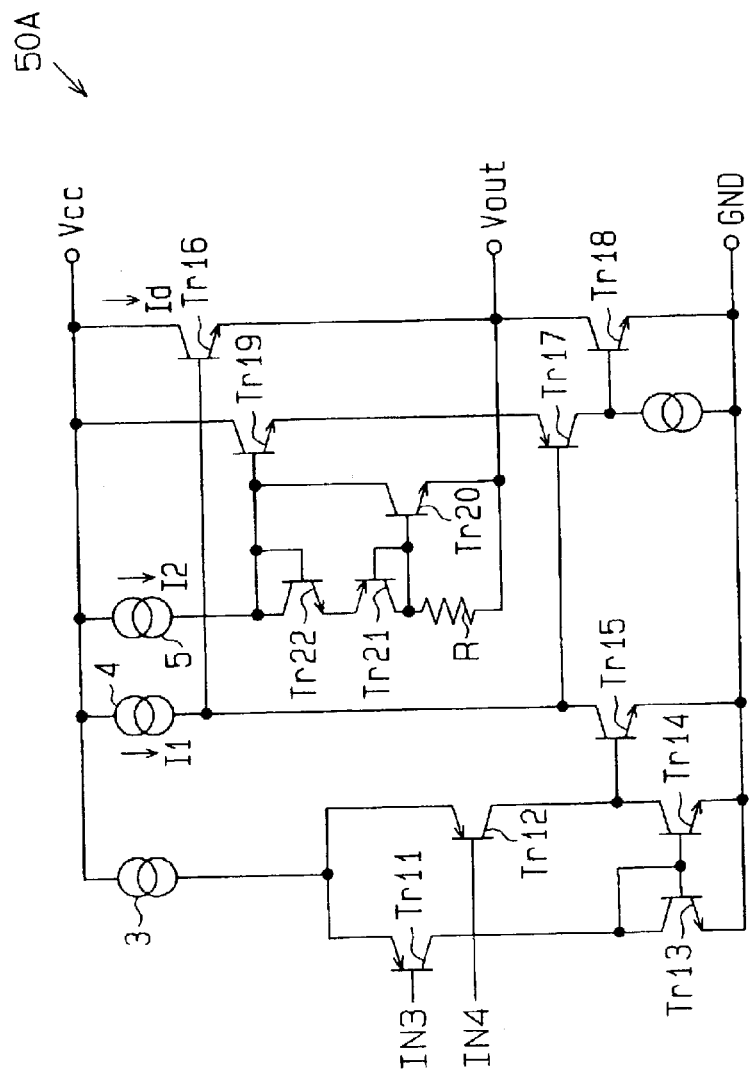
FIG. 2 is a schematic circuit diagram of another prior art op amp.

In the drawings, like numerals are used for like elements throughout.

Figure 3:
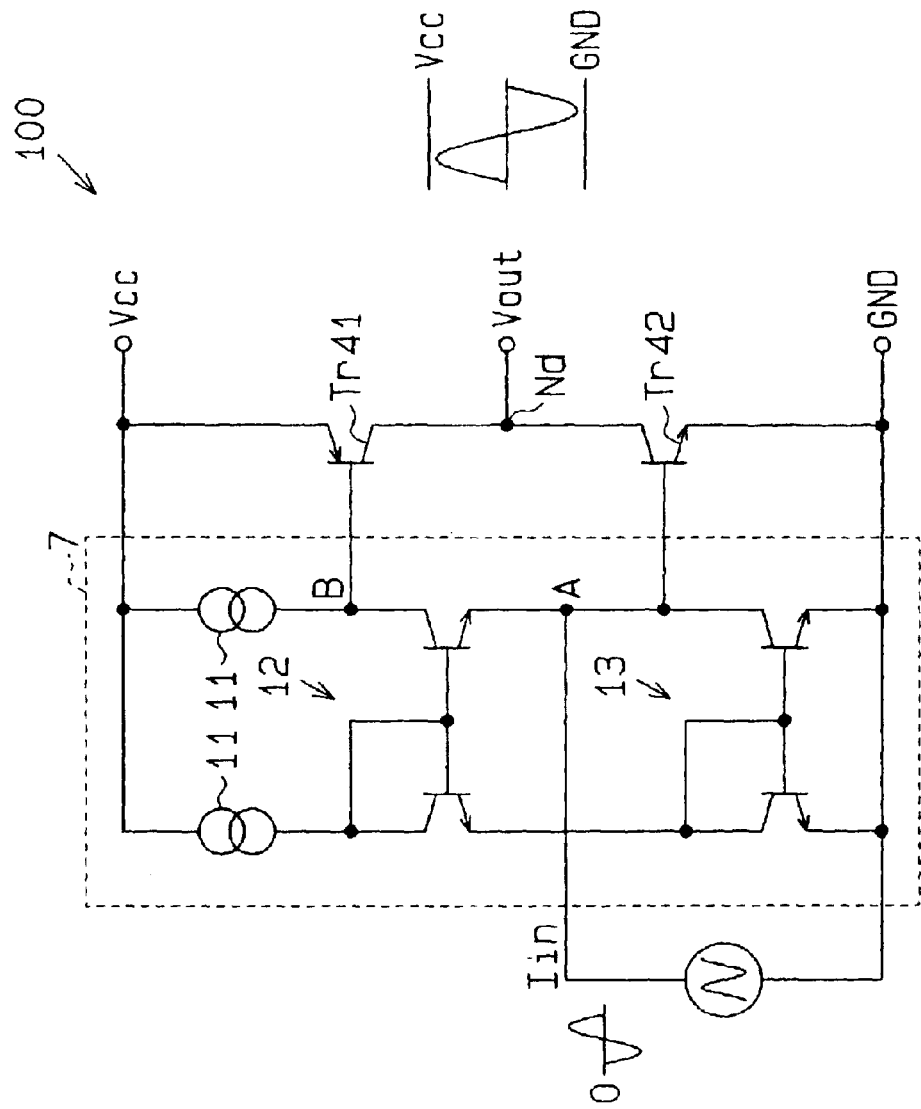
FIG. 3 is a schematic circuit diagram of an op amp according to a first embodiment of the present invention.

FIG. 3 is a schematic circuit diagram of an operational amplifier (op amp) 100 according to a first embodiment of the present invention. The op amp 100 includes a drive unit 7, a source output transistor Tr41, and a sink output transistor Tr42. The source output transistor Tr41 and the sink output transistor Tr42 are connected in series between a high potential power supply Vcc and a low potential power supply GND.

The drive unit 7 drives the output transistors Tr41 and Tr42 in accordance with the input current Iin to generate the output voltage Vout. The output voltage Vout is output from an output node Nd between the output transistors Tr41 and Tr42.

The drive unit 7 includes first and second current mirror circuits 12 and 13 and two current sources 11. The first and second current mirror circuits 12 and 13, which are connected in series between the current source 11 and the low potential ground GND, function in accordance with the current supplied from the current sources 11.

The input current Iin is supplied to a first node A between the first and second current mirror circuits 12 and 13. The base (control terminal) of the sink output transistor Tr42 is connected to the node A. The base (control terminal) of the sink output transistor Tr42 is connected to a second node B between the current sources 11 and the current mirror circuit 12. The first current mirror circuits 12 and 13 function in accordance with changes in the input current Iin. In this state, the base current of the output transistors Tr41 and Tr42 changes and generates the output voltage Vout in accordance with the input current Iin.

Figure 4:
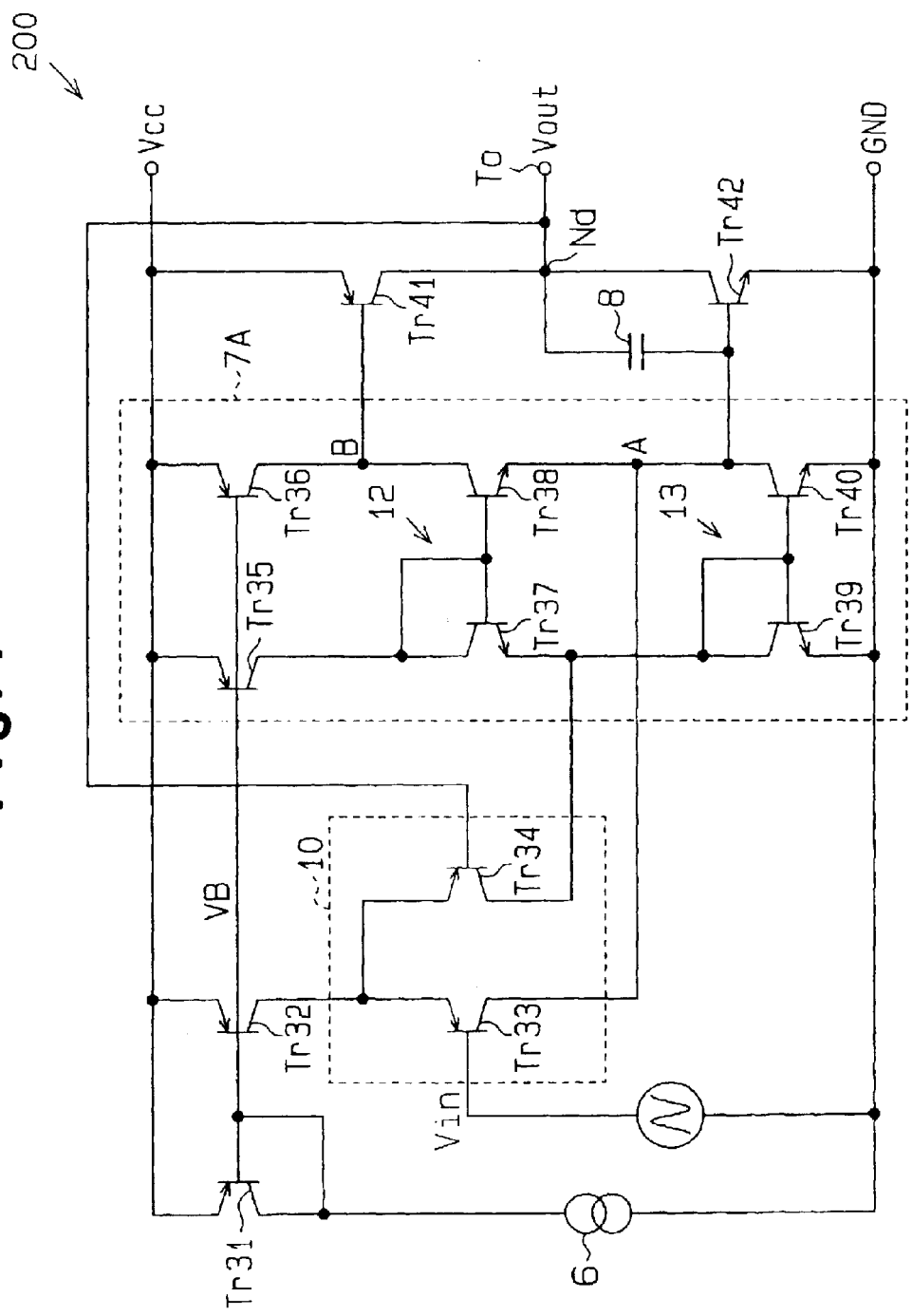
FIG. 4 is a schematic circuit diagram of an op amp according to a second embodiment of the present invention.

FIG. 4 is a schematic circuit diagram of an op amp 200 according to a second embodiment of the present invention. The emitters of the PNP transistors Tr31 and Tr32, which are current mirror circuits, are connected to the power supply Vcc. The bases of the transistors Tr31 and Tr32 are connected to each other and to the collector of the transistor Tr31.

A current source 6 is connected between the collector of the transistor Tr31 and the ground GND. A constant collector current, which is set by the current source 6, flows through the transistors Tr31 and Tr32. A predetermined bias voltage VB is generated at the bases of the transistors Tr31 and Tr32. The transistors Tr31 and Tr32 and the current source 6 configure a bias voltage generation circuit.

The collector of the transistor Tr32 is connected to the emitters of the PNP transistors Tr33 and Tr34. The base of the transistor Tr33 receives the input voltage Vin. The base of the transistor Tr34 receives the output voltage Vout. The transistors Tr33 and Tr34 is a current conversion circuit 10, which converts the differential voltage between the input voltage Vin and the output voltage Vout to a current value. The bias voltage VB and the collector currents of the transistors Tr33 and Tr34 are supplied to the drive unit 7A.

The drive unit 7A includes transistors Tr35 to Tr40. The emitters of the PNP transistors Tr35 and Tr36 are connected to the power supply Vcc, and the bases of the transistors Tr35 and Tr36 are supplied with the bias voltage VB. The transistors Tr35 and Tr36 each function as a current source, which generates a constant collector current. The collector currents of the transistors Tr35 and Tr36 are substantially the same.

The collector of the transistor Tr35 is connected to the bases of the NPN transistors Tr37 and Tr38 and to the collector of the transistor Tr37. The collector of the transistor Tr38 is connected to the collector of the transistor Tr36. The transistors Tr37 and Tr38 configure a first current mirror circuit 12.

The emitter of the transistor Tr37 is connected to the bases of the NPN transistors Tr39 and Tr40 and the collector of the transistor Tr39. The collector of the transistor Tr40 is connected to the emitter of the transistor Tr38.

The emitters of the transistors Tr39 and Tr40 are connected to the ground GND. The transistors Tr39 and Tr40 configure a second current mirror circuit 13. The first and second current mirror circuits 12 and 13 are cascade-connected between the transistors Tr35 and Tr36 and the ground GND.

The collector of the transistor Tr40 is connected to the collector of the transistor Tr33. The collector of the transistor Tr39 is connected to the collector of the transistor Tr34. The collector of the transistors Tr36 and Tr38 are connected to the base of the source output transistor Tr41, which is a PNP transistor. The emitter of the output transistor Tr41 is connected to the power supply Vcc, and the collector of the output transistor is connected to an output terminal To.

The collector of the transistor Tr40 is connected to the base of the sink output transistor Tr42, which is an NPN transistor. The collector of the output transistor Tr42 is connected to the output terminal To, and the emitter of the output transistor Tr42 is connected to the ground GND.

The output transistors Tr41 and Tr42 configure a pure complementary output circuit. The output voltage Vout is generated at the collectors of the output transistors Tr41 and Tr42, and the output voltage Vout is output from the output terminal To. An oscillation prevention capacitor 8 is connected between the collector and base of the transistor Tr42.

The operation of the op amp 200 will now be discussed. In accordance with the power supply Vcc, the bias voltage generation circuit supplies the drive unit 7A with the bias voltage VB and supplies the emitters of the transistors Tr33 and Tr34 with constant current from the collector of the transistor Tr32.

The transistors Tr35 and Tr36 of the drive unit 7a are supplied with a predetermined bias voltage VB so that a constant current flows through the collectors of the transistors Tr35 and Tr36. The collector current of the transistor Tr35 flows as the emitter current of the transistors Tr37 and Tr39, and the same emitter current flows through the transistors Tr38 and Tr40.

The base-emitter voltage drops VBE of the transistors Tr39 and Tr40 are equal, and the base-emitter voltage drop VBE of the transistors Tr37 and Tr38 are equal. In this state, the emitter potentials at the transistors Tr37 and Tr38 are equal, and the base-emitter voltage drop VBE of the output transistor Tr42 and the transistor Tr39 are equal. As a result, an emitter current equal to that of the transistor Tr39 flows through the output transistor Tr42.

A base current corresponding to the difference between the emitter currents of the transistors Tr37 and Tr38 flows through the output transistor Tr41. The output voltage Vout is negatively fed back to the base of the transistor Tr34. The op amp 200 functions so that the collector currents of the output transistors Tr41 and Tr42 are equalized. The feedback operation sets the idling current of the output transistors Tr41 and Tr42.

From a state in which the input voltage Vin and the output voltage Vout are equal, if the input voltage Vin decreases, the collector current of the transistor Tr33 increases and the collector current of the transistor Tr34 decreases. In this state, the base current of the output transistor Tr42 increases, and the collector current of the transistor Tr42 increases. An increase in the base potential at the output transistor Tr42 decreases the collector current of the transistor Tr38. Thus, the base current of the output transistor Tr41 decreases, and the collector current of the transistor Tr41 decreases. In this state, the output voltage Vout decreases, and the output voltage Vout is converged so that it is equal to the input voltage Vin. Afterward, an idling current flows through the output transistors Tr41 and Tr42.

From a state in which the input voltage Vin and the output voltage Vout are equal, if the input voltage Vin increases, the collector current of the transistor Tr33 decreases and the collector current of the transistor Tr34 increases. This decreases the base current of the output transistor Tr42 and decreases the collector current of the transistor Tr42. A decrease in the base potential at the output transistor Tr42 increases the collector current of the transistor Tr38. Thus, the base current of the output transistor Tr41 increases, and the collector current of the transistor Tr41 increases. As a result, the output voltage Vout increases, and the output voltage Vout is converged so that it is equal to the input voltage Vin. Afterward, an idling current flows through the output transistors Tr41 and Tr42.

The op amp 200 of the second embodiment has the advantages described below.

(1) The pure complementary output circuit includes the PNP source output transistor Tr41 and the NPN sink output transistor Tr42. Thus, the maximum value of the output voltage Vout is increased to the level of the power supply Vcc, and the minimum value is decreased to the level of the ground GND.

(2) The maximum range of the output voltage Vout is from substantially the low potential power supply GND to the high potential power supply Vcc. Thus, the desired amplitude of the output voltage is guaranteed even if the voltage of the power supply is decreased.

(3) The transistor Tr35 of the drive unit 7A sets the idling current of the output transistors Tr41 and Tr42. The first and second current mirror circuits set the load drive capacity of the output transistors Tr41 and Tr42 in accordance with the input current. Thus, the load drive capacity does not decrease even when the idling current is decreased. Accordingly, sufficient load drive capacity may be guaranteed while reducing power consumption.

(4) The output signal of the current conversion circuit 10 is provided to a node between the first current mirror circuit 12 and the second current mirror circuit 13. The base of the output transistor Tr42 is connected to the emitter of the transistor Tr38 in the first current mirror circuit 12, and the base of the transistor Tr41 is connected to the collector of the transistor Tr38. Thus, the output transistors Tr41 and Tr42 are driven in accordance with the operation of the first and second current mirror circuits 12 and 13.

(5) There is no transistor between the collector of the transistor Tr33, which receives the input voltage Vin, and the base of the output transistor Tr42. The output transistor Tr41 is driven by the first current mirror circuit 12. Accordingly, the number of transistors for generating the output voltage Vout may be decreased in accordance with the input voltage Vin to increase the operation speed.

Figure 5:
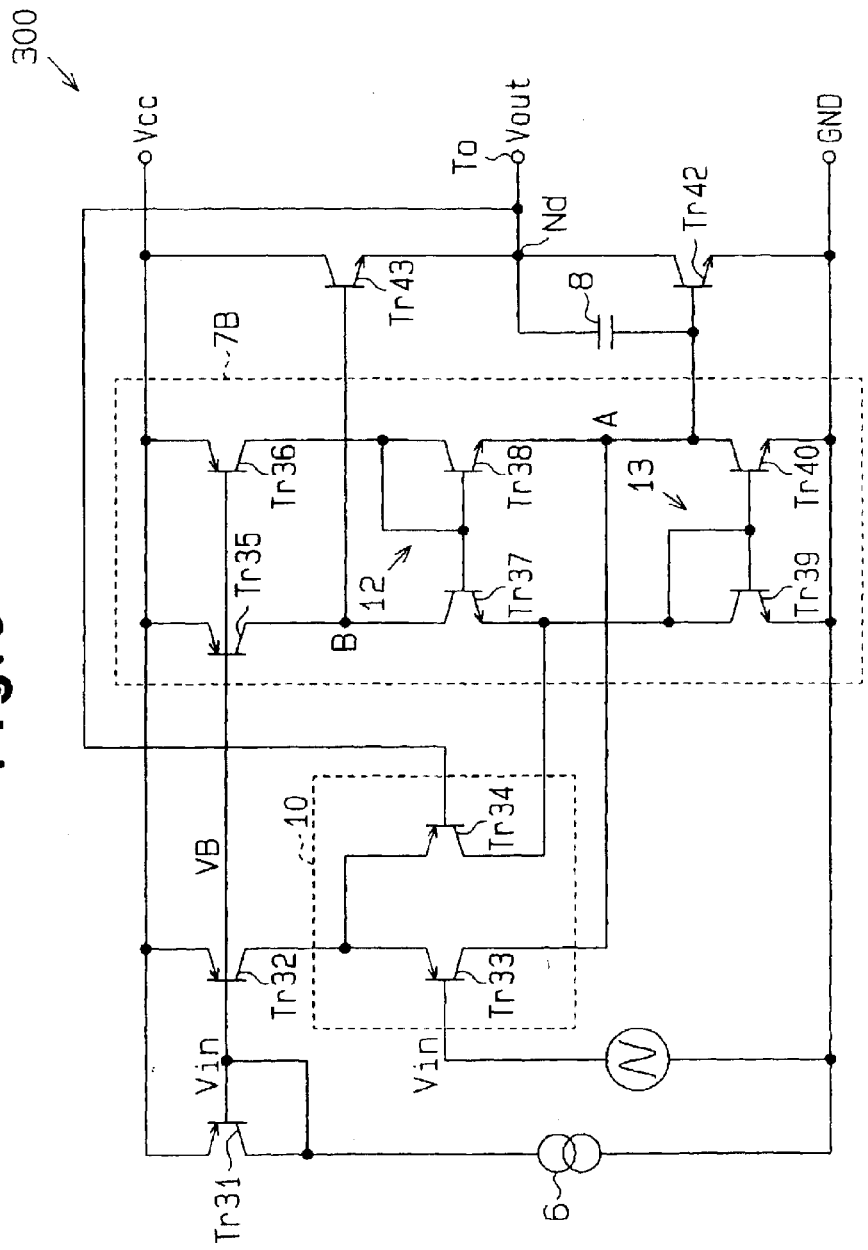
FIG. 5 is a schematic circuit diagram of an op amp according to a third embodiment of the present invention.

FIG. 5 is a schematic circuit diagram of an op amp 300 according to a third embodiment of the present invention. The op amp 300 of the third embodiment uses an NPN source output transistor Tr43 in lieu of the PNP source output transistor Tr41 of the second embodiment.

The output transistor Tr43 must be driven in a phase that is reversed from that of the output transistor Tr41 in the second embodiment. Thus, the base of the output transistor Tr43 is connected to the collector of the transistor Tr37 in the first current mirror circuit 12. Further, the bases of the transistors Tr37 and Tr38 are connected to the collector of the transistor Tr38. The remaining configuration is the same as that of the op amp 200 in the second embodiment.

The op amp 300 of the third embodiment has the advantages described below.

(1) The voltage drop between the base of the NPN source output transistor Tr43 and the power supply Vcc occurs only in the voltage between the collector and emitter of the transistor Tr35. Thus, the base potential of the output transistor tr43 may be increased to the vicinity of the power supply Vcc. As a result, in contrast with the prior art, the maximum output voltage Vout is increased to guarantee sufficient amplitude of the output voltage.

(2) As long as an NPN transistor has the same size as a PNP transistor, the NPN transistor has a high current drive capacity. Accordingly, due to the NPN output transistor Tr43, the load drive capacity of the op amp 300 is greater than that of the op amp 200 of the second embodiment.

Figure 6:
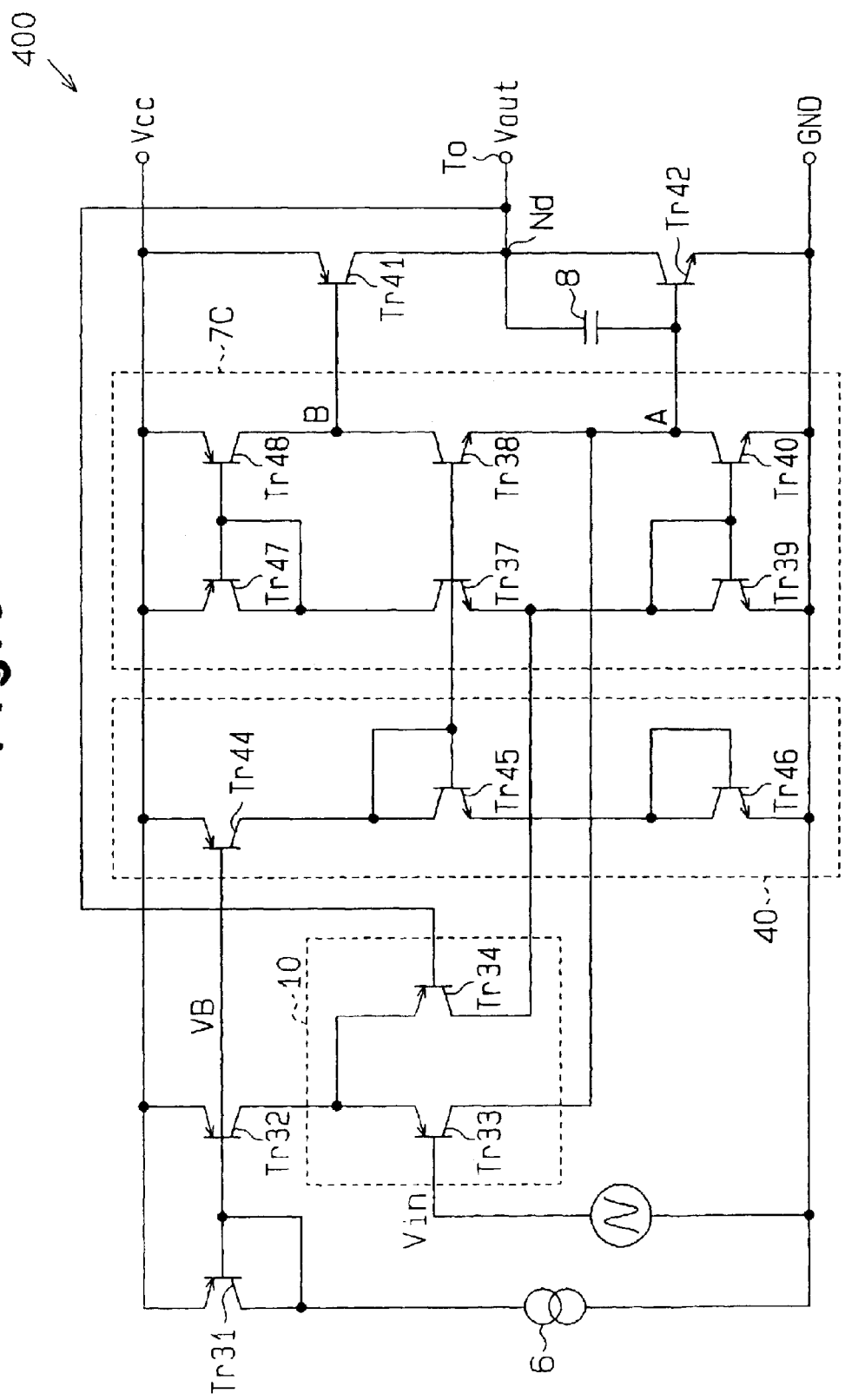
FIG. 6 is a schematic circuit diagram of an op amp according to a fourth embodiment of the present invention.

FIG. 6 is a schematic circuit diagram of an op amp 400 according to a fourth embodiment of the present invention. In addition to the configuration of the second embodiment, the op amp 400 of the fourth embodiment includes a bias voltage generation circuit 40. The bias voltage generation circuit 40, which is configured by transistors Tr44 to Tr46, generates the base voltage of the transistors Tr37 and Tr38.

The emitter of the PNP transistor Tr44 is connected to the power supply Vcc, and the base of the transistor Tr44 receives the bias voltage VB. Accordingly, the collector of the transistor Tr44 generates a constant current in accordance with the bias voltage VB. The collector of the transistor Tr44 is connected to the collector and base of the NPN transistor Tr45. The emitter of the transistor Tr45 is connected to the collector and the base of the NPN transistor Tr46. The emitter of the transistor Tr46 is connected to the ground GND.

The bases of the transistors Tr37 and Tr38 in a drive unit 7C are supplied with the base voltage of the transistor Tr45, which serves as a bias voltage. The collector of the transistor Tr37 is connected to the collector of the PNP transistor Tr47, and the collector of the transistor Tr38 is connected to the collector of the PNP transistor Tr48. The bases of the transistors Tr47 and Tr48 are connected to the collector of the transistor Tr37. The emitters of the transistors Tr47 and Tr48 are connected to the power supply Vcc.

The bases of the transistors Tr37 and Tr38 are supplied with constant voltage, which is set by the base-emitter voltage drops VBE of the transistors Tr45 and Tr46. The collector current of the transistor Tr48 is supplied to the transistor Tr38 in accordance with the collector current of the transistor Tr37.

In the op amp 400 of the fourth embodiment, the setting of the base voltage of the transistors Tr37 and Tr38 and the setting of the idling current with the transistors Tr47 and Tr48 are performed separately.

Figure 7:
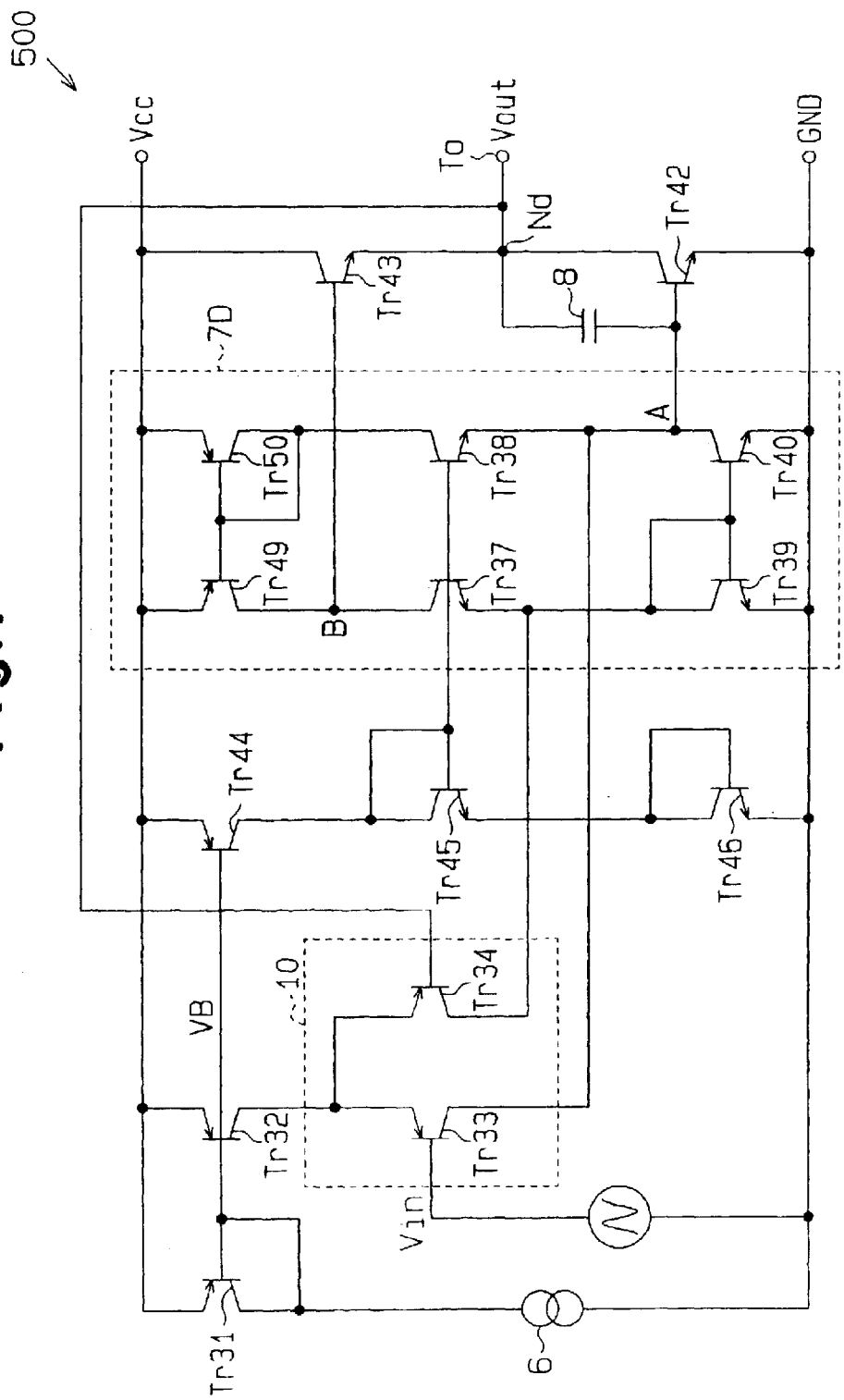
FIG. 7 is a schematic circuit diagram of an op amp according to a fifth embodiment of the present invention.

FIG. 7 is a schematic circuit diagram of an op amp 500 according to a fifth embodiment of the present invention. In addition to the configuration of the op amp 300 in the third embodiment, the op amp 500 of the fifth embodiment includes the bias voltage generation circuit 40 of FIG. 6.

The bias voltage generation circuit 40 generates the base voltage of the transistors Tr37 and Tr38 in a drive unit 7D of the op amp 500. The collector currents of the transistors Tr37 and Tr38 are supplied from a current mirror circuit, which is configured by PNP transistors Tr49 and Tr50.

Figure 8:
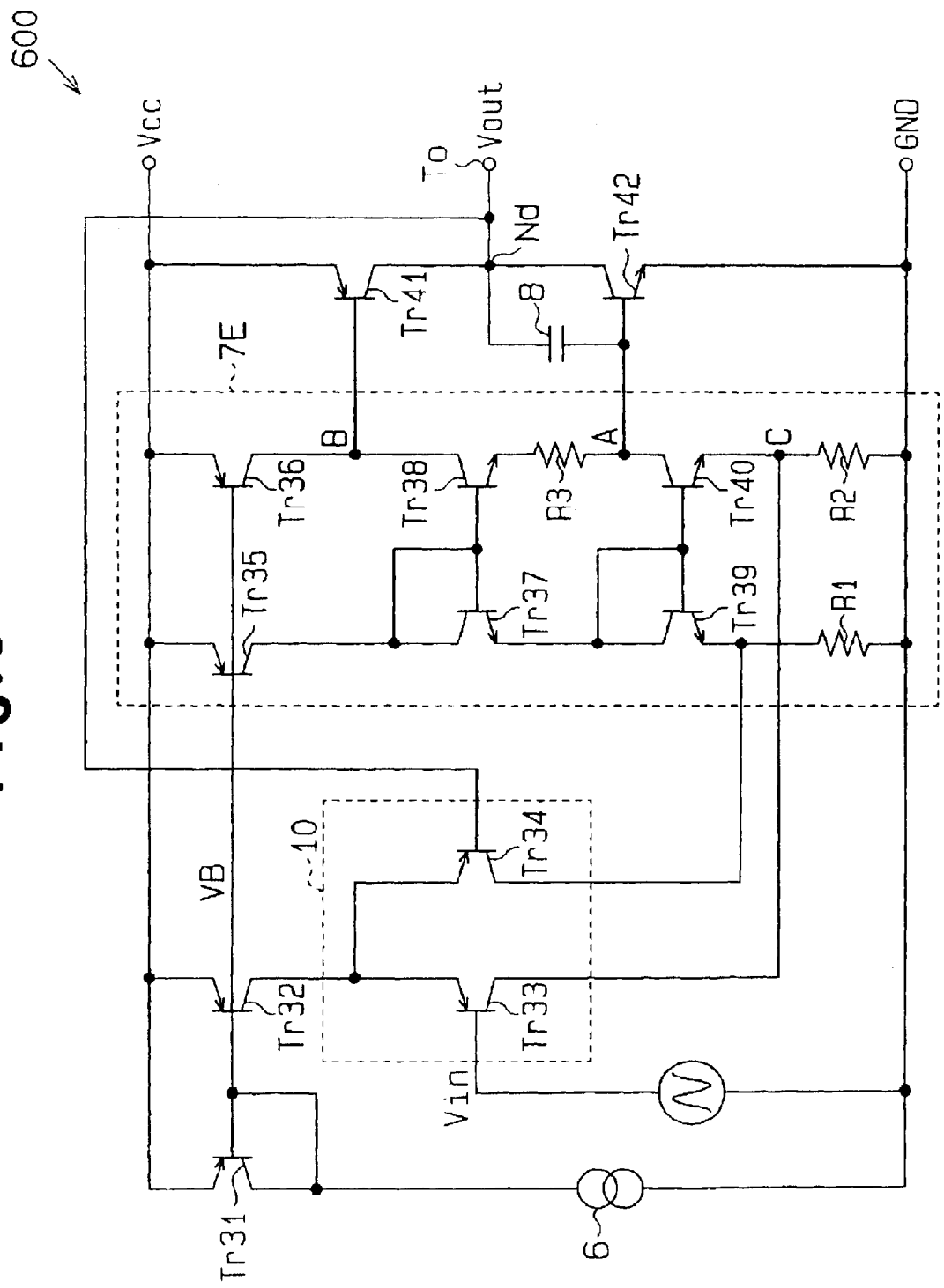
FIG. 8 is a schematic circuit diagram of an op amp according to a sixth embodiment of the present invention.

FIG. 8 is a schematic circuit diagram of an op amp 600 according to a sixth embodiment of the present invention. In the op amp 600 of the sixth embodiment, the drive unit differs from that of the op amp 200 in the second embodiment 200. In the op amp 600, the collector of the transistor Tr33 in the current conversion circuit 10 is connected to the emitter of the transistor Tr40 of a drive unit 7E. The collector of the transistor Tr34 is connected to the emitter of the transistor Tr39 in the drive unit 7E.

Further, the drive unit 7E includes resistors R1 to R3. The resistor R1 is connected between the emitter of the transistor Tr39 and the ground GND. The resistor R2 is connected between the emitter of the transistor Tr40 and the ground GND. The resistor R3 is connected between the base of the output transistor Tr42, the collector of the transistor Tr40, and the emitter of the transistor Tr38. The collector of the transistor Tr33 is connected to a third node C between the emitter of the transistor Tr40 and the resistor R2.

In the op amp 600 of the sixth embodiment, the emitter potential of the transistors Tr39 and Tr40 changes in accordance with the collector current of the transistors Tr33 and Tr34. The collector current of the transistors Tr39 and Tr40 changes in accordance with the change in the emitter potential of the transistors Tr39 and Tr40. Further, the collector potential at the transistors Tr39 and Tr40 changes in accordance with the change in the collector potential of the transistors Tr39 and Tr40.

The op amp 600 has the same advantages as the op amp 200 of the second embodiment. The resistor R3 cancels an increase of the base potential at the output transistor Tr42 that is caused by the resistor R2 and prevents the collector current of the output transistor Tr42 from increasing in an unnecessary manner.

Figure 9:
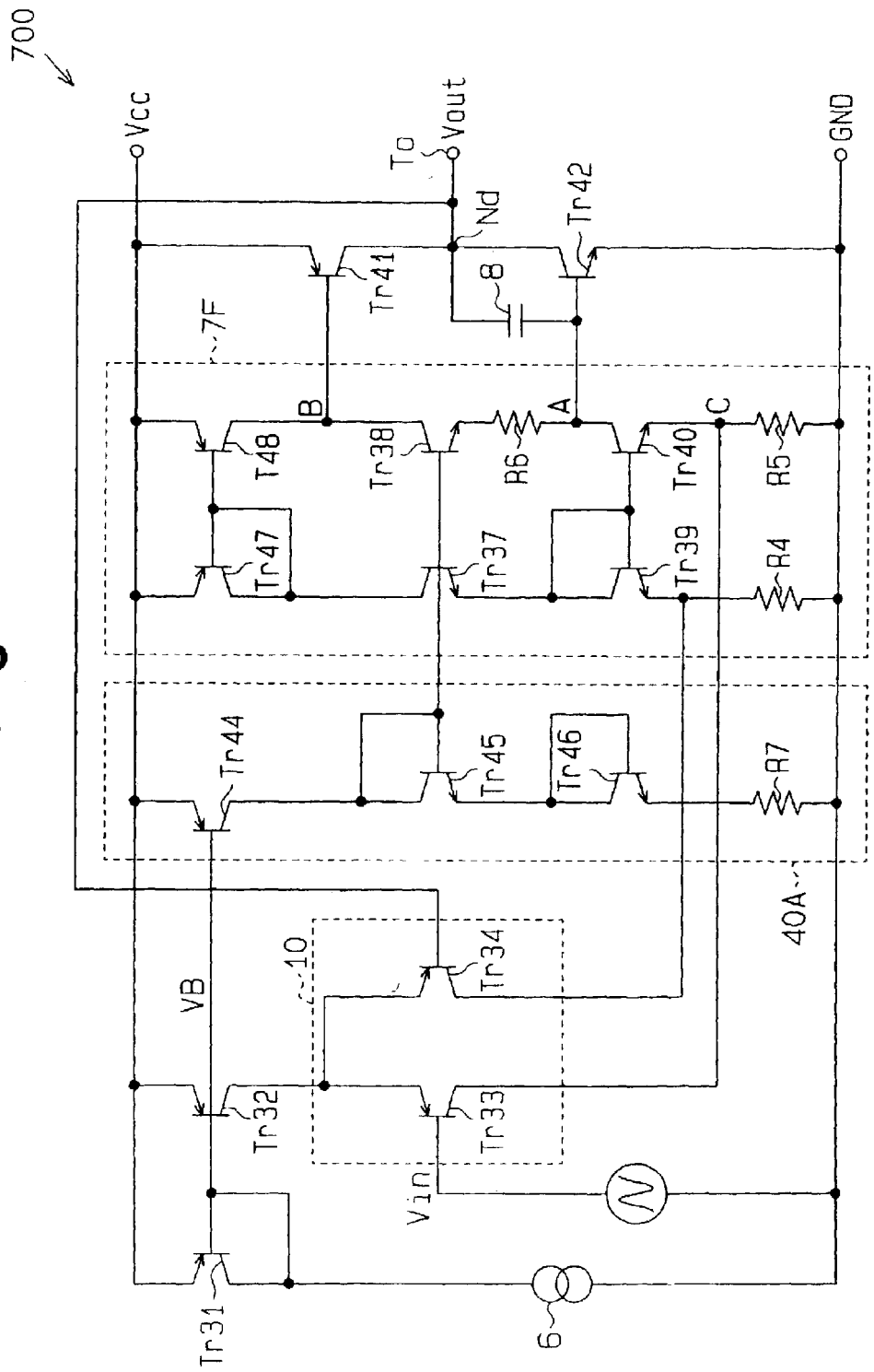
FIG. 9 is a schematic circuit diagram of an op amp according to a seventh embodiment of the present invention.

FIG. 9 is a schematic circuit diagram of an op amp 700 according to a seventh embodiment of the present invention. In the op amp 700 of the seventh embodiment, the drive unit and bias voltage generation circuit differ from those of the op amp 400 in the fourth embodiment 400. In the op amp 700, the collector of the transistor Tr33 is connected to the emitter of the transistor Tr39 of a drive unit 7F. The collector of the transistor Tr34 is connected to the emitter of the transistor Tr40 in the drive unit 7F.

The drive unit 7F includes resistors R4 to R6. The resistor R4 is connected between the emitter of the transistor Tr39 and the ground GND. The resistor R5 is connected between the emitter of the transistor Tr40 and the ground GND. The resistor R6 is connected between the base of the output transistor Tr42, the collector of the transistor Tr40, and the emitter of the transistor Tr38.

The bias voltage generation circuit 40A includes a resistor R7 connected between the emitter of the transistor Tr46 and the ground GND. The resistor R7 increases the bias voltage supplied to the bases of the transistors Tr37 and Tr38 to adapt to the increase of the emitter potential at the transistors Tr37 and Tr38 resulting from the incorporation of the resistors R4 and R5.

It should be apparent to those skilled in the art that the present invention may be embodied in many other specific forms without departing from the spirit or scope of the invention. Particularly, it should be understood that the present invention may be embodied in the following forms.

In the sixth and seventh embodiment, the source output transistor Tr41 may be an NPN transistor.

The present examples and embodiments are to be considered as illustrative and not restrictive, and the invention is not to be limited to the details given herein, but may be modified within the scope and equivalence of the appended claims.

What is claimed is:

1. An operational amplifier for use with high and low potential power supplies and for receiving an input current, the operational amplifier comprising:
   a first output transistor connected to the high potential power supply and having a control terminal;
   a second output transistor connected between the first output transistor and the low potential power supply and having a control terminal, with an output voltage being available at an output node between the first output transistor and the second output transistor; and
   a drive unit connected to the first and second output transistors to drive the first and second output transistors in accordance with the input current, wherein the drive unit including:
      a current source connected to the high potential power supply;
      a first current mirror circuit connected to the current source; and
      a second current mirror circuit connected between the first current mirror circuit and the low potential power supply;
   wherein the input current is supplied to a first node between the first and second current mirror circuits, the control terminal of the second output transistor is connected to the first node, and the control terminal of the first output transistor is connected to a second node between the current source and the first current mirror circuit.

2. The operational amplifier according to claim 1, further comprising:
   a current conversion circuit connected to the first node to generate the input current in accordance with a differential voltage between an input voltage and the output voltage.

3. The operational amplifier according to claim 1, wherein the first output transistor is a PNP transistor having an emitter connected to the high potential power supply, and the second output transistor is an NPN transistor having an emitter connected to the low potential power supply.

4. The operational amplifier according to claim 1, wherein the first output transistor is an NPN transistor having a collector connected to the high potential power supply, and the second output transistor is an NPN transistor having an emitter connected to the low potential power supply.

5. The operational amplifier according to claim 1, further comprising:
   a bias voltage generation circuit connected to the drive unit to generate bias voltage that is supplied to the drive unit.

6. The operational amplifier according to claim 5, wherein the bias voltage generation circuit includes a diode-connected transistor to generate the bias voltage.

7. The operational amplifier according to claim 1, further comprising:
   a capacitor connected between the output node and the control terminal of the second output transistor.

8. An operational amplifier for use with high and low potential power supplies and for receiving an input current, the operational amplifier comprising:
   a first output transistor connected to the high potential power supply and having a control terminal;
   a second output transistor connected between the first output transistor and the low potential power supply and having a control terminal, with an output voltage being available at an output node between the first output transistor and the second output transistor; and
   a drive unit connected to the first and second output transistors to drive the first and second output transistors in accordance with the input current, wherein the drive unit including:
      a current source connected to the high potential power supply;
      a first current mirror circuit connected to the current source;
      a second current mirror circuit connected between the first current mirror circuit and the low potential power supply; and
      a first resistor connected between the second current mirror circuit and the low potential power supply;
   wherein the control terminal of the second output transistor is connected to a first node between the first and second current mirror circuits, the control terminal of the first output transistor is connected to a second node between the current source and the first current mirror circuit, and the input current is supplied to a third node between the second current mirror circuit and the first resistor.

9. The operational amplifier according to claim 8, further comprising:
   a current conversion circuit connected to the third node to generate the input current in accordance with a differential voltage between an input voltage and the output voltage.

10. The operational amplifier according to claim 8, wherein the first output transistor is a PNP transistor having an emitter connected to the high potential power supply, and the second output transistor is an NPN transistor having an emitter connected to the low potential power supply.

11. The operational amplifier according to claim 8, wherein the first output transistor is an NPN transistor having a collector connected to the high potential power supply, and the second output transistor is an NPN transistor having an emitter connected to the low potential power supply.

12. The operational amplifier according to claim 8, further comprising:
   a bias voltage generation circuit connected to the drive unit to generate bias voltage that is supplied to the drive unit.

13. The operational amplifier according to claim 12, wherein the bias voltage generation circuit includes:
   a diode-connected transistor for generating the bias voltage; and
   a second resistor connected between the diode-connected transistor and the low potential power supply.

14. The operational amplifier according to claim 8, further comprising:
   a capacitor connected between the output node and the control terminal of the second output transistor.

15. An operational amplifier for use with high and low potential power supplies and a current source, the operational amplifier comprising:

a first PNP transistor having a collector connected to the current source, a base connected to the collector, and an emitter connected to the high potential power supply;

a second PNP transistor having a base connected to the base of the first PNP transistor and an emitter connected to the high potential power supply;

a third PNP transistor having an emitter connected to a collector of the second PNP transistor;

a fourth PNP transistor having an emitter connected to the collector of the second PNP transistor and to the emitter of the third PNP transistor;

a fifth PNP transistor having a base connected to the bases of the first and second PNP transistors and an emitter connected to the high potential power supply;

a sixth PNP transistor having a base connected to the base of the fifth PNP transistor and an emitter connected to the high potential power supply;

a first NPN transistor having a collector and a base connected to a collector of the fifth PNP transistor and an emitter connected to a collector of the fourth PNP transistor;

a second NPN transistor having a base connected to the collector of the fifth PNP transistor, a collector connected to the collector of the sixth PNP transistor, and an emitter connected to a collector of the third PNP transistor;

a third NPN transistor having a collector and a base connected to the emitter of the first NPN transistor and an emitter connected to the low potential power supply;

a fourth NPN transistor having a collector connected to the emitter of the second NPN transistor, a base connected to the base of the third NPN transistor, and an emitter connected to the low potential power supply;

a seventh PNP transistor having an emitter connected to the high potential power supply and a base connected to the collectors of the sixth PNP transistor and the second NPN transistor; and a fifth NPN transistor having a collector connected to a collector of the seventh PNP transistor, a base connected to the emitter of the second NPN transistor and to the collector of the fourth NPN transistor, and an emitter connected to the low potential power supply.

16. The operational amplifier according to claim 15, further comprising a capacitor connected between the collector and base of the fifth NPN transistor.

* * * * *